US006978827B2

(12) United States Patent
 Armstrong

(10) Patent No.: US 6,978,827 B2
(45) Date of Patent: Dec. 27, 2005

(54) ACTIVE HEAT SINK

(75) Inventor: Ross Armstrong, Cambridge (CA)

(73) Assignee: Tyco Electronics Canada Ltd., Ontario (CA)

( * ) Notice: Subject to any disclaimer, the term of this patent is extended or adjusted under 35 U.S.C. 154(b) by 32 days.

(21) Appl. No.: 10/443,999

(22) Filed: May 23, 2003

(65) Prior Publication Data

US 2004/0231826 A1 Nov. 25, 2004

(51) Int. Cl.[7] .............................................. F28F 7/00
(52) U.S. Cl. .................. 165/80.3; 165/121; 361/697; 361/710; 257/718; 257/727
(58) Field of Search .............................. 165/121, 80.3, 165/122, 185; 361/695, 697, 710; 257/718, 257/726, 727

(56) References Cited

U.S. PATENT DOCUMENTS

| | | | | |
|---|---|---|---|---|
| 5,038,858 A | * | 8/1991 | Jordan et al. ............... | 165/185 |
| 5,335,722 A | * | 8/1994 | Wu ............................. | 165/122 |
| 5,494,098 A | | 2/1996 | Morosas ..................... | 165/121 |
| 5,535,094 A | | 7/1996 | Nelson et al. .............. | 361/697 |
| 5,706,169 A | * | 1/1998 | Yeh ............................. | 361/690 |
| 5,828,553 A | * | 10/1998 | Chiou ......................... | 361/704 |
| 5,912,802 A | | 6/1999 | Nelson ....................... | 361/695 |
| 5,943,209 A | * | 8/1999 | Liu ............................. | 361/695 |
| 6,061,239 A | * | 5/2000 | Blomquist .................. | 361/704 |
| 6,104,609 A | * | 8/2000 | Chen .......................... | 361/695 |
| 6,181,559 B1 | * | 1/2001 | Seo ............................. | 361/704 |
| 6,244,331 B1 | | 6/2001 | Budelman .................. | 165/80.3 |
| 6,317,319 B1 | | 11/2001 | Lewis et al. ................ | 361/695 |
| 6,332,251 B1 | * | 12/2001 | Ho et al. ...................... | 24/459 |
| 6,404,633 B1 | * | 6/2002 | Hsu ........................... | 361/703 |
| 6,449,152 B1 | * | 9/2002 | Lin ............................ | 361/697 |
| 6,450,248 B1 | * | 9/2002 | Chang ........................ | 165/80.3 |
| 6,459,580 B1 | | 10/2002 | Della Fiora et al. ........ | 361/697 |
| 6,525,941 B1 | * | 2/2003 | Lai ............................. | 361/697 |
| 2001/0027855 A1 | | 10/2001 | Budelman .................. | 165/80.3 |
| 2002/0007936 A1 | | 1/2002 | Woemer et al. ............ | 165/80.3 |
| 2002/0139633 A1 | | 10/2002 | Armstrong et al. ....... | 228/248.1 |
| 2005/0045311 A1 | * | 3/2005 | Chen et al. ............ | 165/104.33 |

FOREIGN PATENT DOCUMENTS

WO    WO 02/097881    5/2001

* cited by examiner

Primary Examiner—Terrell McKinnon
(74) Attorney, Agent, or Firm—Wilmer Cutler Pickering Hale and Dorr LLP

(57) ABSTRACT

A cooling device is provided for dissipating heat from a heat source such as, e.g., an integrated circuit. The cooling device includes a heat sink having a fin structure, a blower assembled with the heat sink for moving air through the fin structure, and a spring attachment mechanism for clamping the heat sink to the heat source.

56 Claims, 16 Drawing Sheets

ACTIVE HEAT SINK

BACKGROUND OF THE INVENTION

1. Field of the Invention

The present invention relates generally to thermal management devices used for dissipating heat from heat sources such as electronic components and other devices. More particularly, the invention relates to active heat sinks.

2. Description of Related Art

Thermal management devices such as heat sinks are widely used in computers, projection systems, televisions and other devices that produce unwanted heat. Unwanted heat is produced, e.g., in computers by inefficiencies in electronic components such as microprocessors and other integrated circuits.

As integrated circuits and other electronic devices are made smaller and designed to operate at increasingly higher processing speeds, they generate increasing amounts of unwanted heat during operation. Electronic components typically operate efficiently only under a certain range of threshold temperatures. Excessive heat generated during operation can harm device performance and reliability and can cause system failure. Thermal management has accordingly become an increasingly important element in the design of electronic products.

Heat sinks are typically used to dissipate heat from the surface of electronic components to a cooler environment, usually ambient air. The heat transfer rate from heat source surfaces directly to the surrounding air is typically poor. A heat sink seeks to increase the heat transfer efficiency primarily by increasing the surface area that is in direct contact with the air. This allows more heat to be dissipated and thereby lowers the device operating temperature.

Heat sinks used for cooling electronic components typically include a thermally conductive baseplate that interfaces directly with the device to be cooled and a set of plate fins extending from the baseplate. The fins increase the surface area that is in direct contact with the air, and thereby increase the heat transfer efficiency between the heat source and ambient air.

Active heat sinks are heat sinks equipped with air handling devices (such as axial fans and blowers) for forcing airflow across the surfaces of the heat sink fins. The airflow further increases heat transfer from the fins to the surrounding air.

BRIEF SUMMARY OF EMBODIMENTS OF THE INVENTION

In accordance with one or more embodiments of the invention, a cooling device is provided for dissipating heat from a heat source such as, e.g., an integrated circuit. The cooling device includes a heat sink having a fin structure. It also includes an air moving device such as, e.g., a blower, assembled with the heat sink for moving air through the fin structure, and a spring attachment mechanism for clamping the heat sink to the heat source.

In accordance with one or more further embodiments of the invention, a cooling device is provided for dissipating heat from a heat source. The cooling device includes a heat sink having a primary fin structure and a secondary fin structure, a thermally conductive element for transferring heat from the heat source to the primary and secondary fin structures, and an air moving device such as a blower assembled with the heat sink for drawing air through the primary fin structure and for exhausting air through the secondary fin structure.

In accordance with one or more further embodiments of the invention, a cooling device is provided for dissipating heat from a heat source. The cooling device includes a heat sink including a fin structure, an air moving device such as a blower mounted on the heat sink for moving air through the fin structure, a plate structure mounted on the blower for providing structural support for the blower, and a spring attachment mechanism mounted on the plate structure for clamping the heat sink to the heat source.

These and other features will become readily apparent from the following detailed description wherein embodiments of the invention are shown and described by way of illustration. As will be realized, the invention is capable of other and different embodiments and its several details may be capable of modifications in various respects, all without departing from the invention. Accordingly, the drawings and description are to be regarded as illustrative in nature and not in a restrictive or limiting sense with the scope of the application being indicated in the claims.

DETAILED DESCRIPTION OF THE PREFERRED EMBODIMENTS

Figure 1:
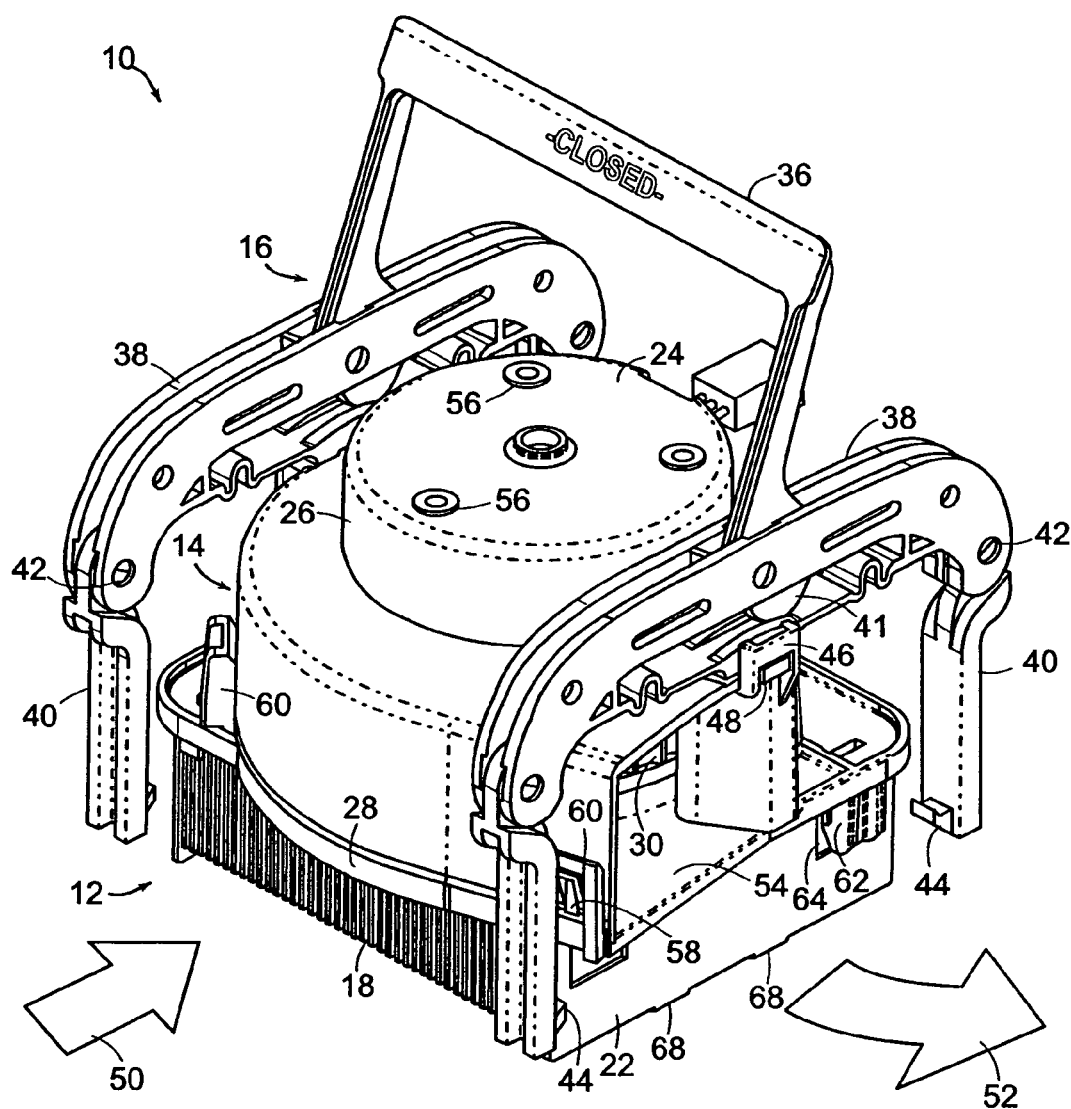
FIG. 1 is a perspective view of an active heat sink device in accordance with one or more embodiments of the invention.
Figure 2:
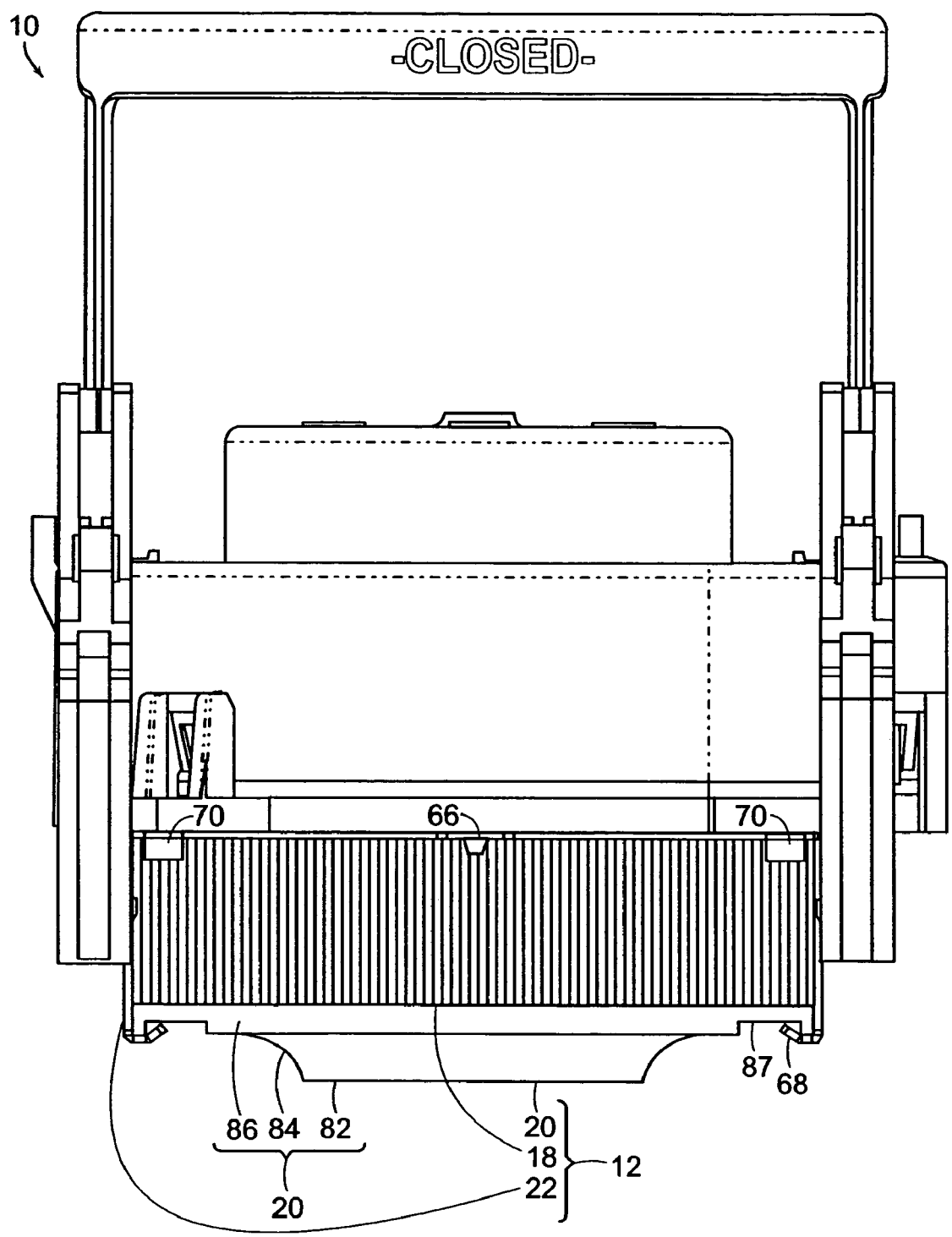
FIG. 2 is a front view of the FIG. 1 active heat sink device.
Figure 3:
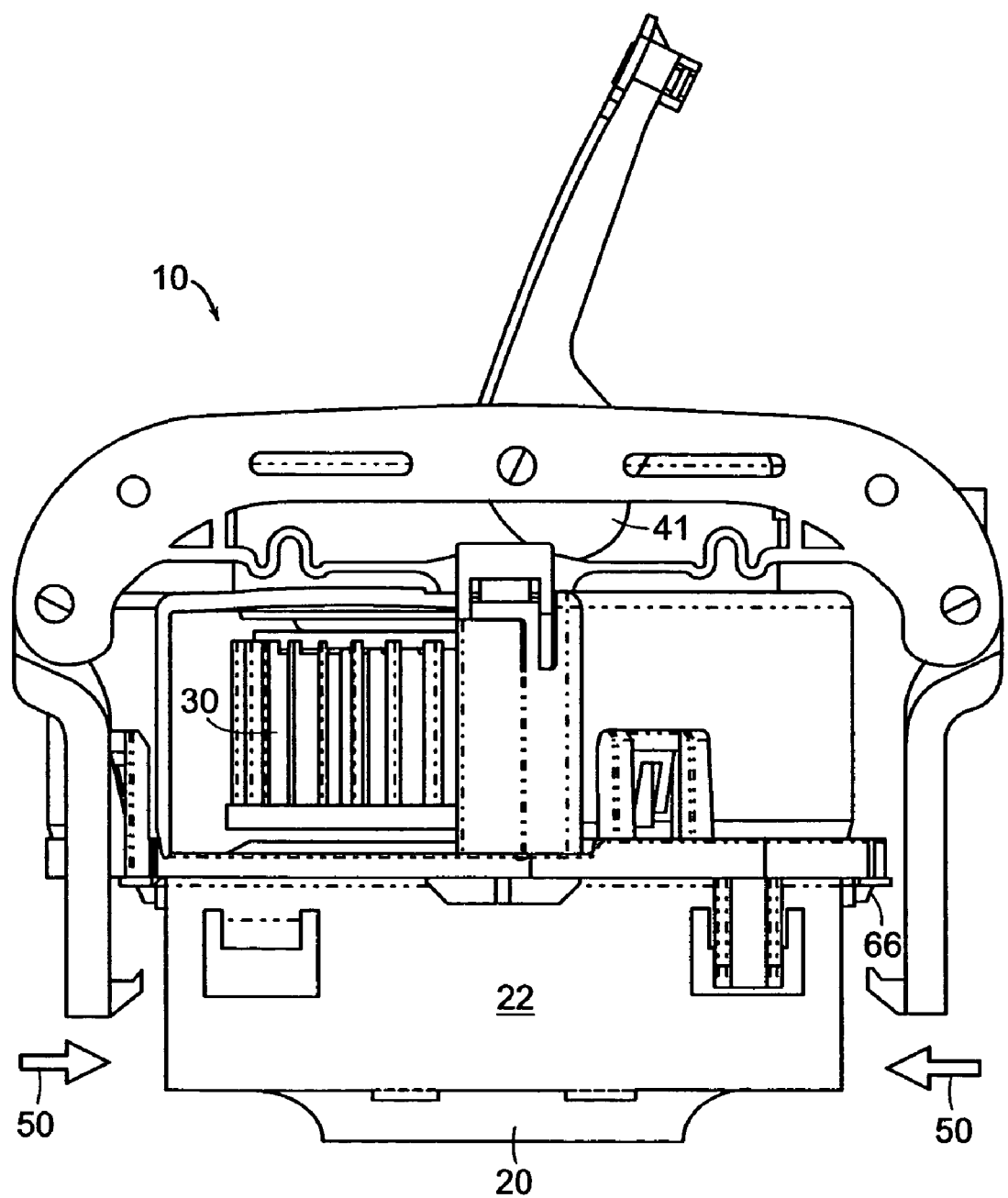
FIG. 3 is a side view of the FIG. 1 active heat sink device.

The present invention is generally directed to active heat sink devices that can efficiently dissipate heat from a heat source such as an electronic component (e.g., a microprocessor or other integrated circuit) and other devices.

FIGS. 1–4 illustrate an active heat sink device or cooling device 10 in accordance with one or more embodiments of the invention. The active heat sink device 10 generally includes a heat sink assembly 12 and an air moving device 14 for moving air through the heat sink assembly 12. An attachment mechanism such as a spring clip attachment mechanism 16 can be used to clamp the active heat sink device 10 to a device 17 to be cooled, e.g., an electronic component such as an integrated circuit (shown in FIG. 4).

The heat sink assembly 12 includes a fin structure 18 and a thermally conductive base plate 20 supporting and in thermal contact with the fin structure 18. The base plate 20 can comprise various thermally conductive materials including, e.g., copper and aluminum. Other base plate materials are also possible including, e.g., pyrolytic graphite and ALSiC-9 materials. The fin structure 18 is preferably a set of densely arranged thin plate fins. The fin structure preferably has a folded fin (i.e., a convoluted fin) construction as shown, e.g., in FIGS. 5 and 6. Alternately, the fin structure can comprise a set of plate fins that are assembled together as shown in FIG. 7. The heat sink assembly 12 can also include a shroud attachment element 22, which covers portions of the folded fin structure 18 and facilitates assembly of the heat sink assembly 12 with the air moving device 14. The shroud attachment element 22 also protects the folded fin structure, which can be fragile. The shroud can also be a functional part of the heat sink, i.e., as a heat conductor. In addition, the shroud can aid in the assembly of the heat sink assembly by securing the fin structure.

The air moving device 14 is mounted above the heat sink assembly 12, and causes air movement between the fins of the folded fin structure 18. The air moving device 14 can be one of various types of blowers and fans including, but not limited to, axial-flow fans, centrifugal fans, axial centrifugal fans, roof ventilators, cross-flow blowers, and vortex blowers. The air moving device 14 shown in the exemplary figures is a backward curved type centrifugal fan, which is often identified in the industry as a blower. The particular type of air moving device selected for a given application can be based on desired airflow/pressure drop characteristics, which can be characterized by a dimensionless parameter called specific speed. Thermal solutions are generally moving from high airflow/low pressure drop solutions (characterized, e.g., by axial fans having a specific speed of object 200,000) to medium air flow/high pressure drop solutions (characterized, e.g., by centrifugal fans having a specific speed of about 50,000). The intake to the blower is located directly above and preferably centered on the fin structure 18. The blower can include a brush-less DC motor assembly 24, a blower motor side housing 26, a blower inlet side housing 28, and an impeller 30.

Use of blowers is preferred because blowers can develop high pressure drop levels at relatively low airflow levels. Other types of air moving devices can also be used including, e.g., axial fans.

Figure 4:
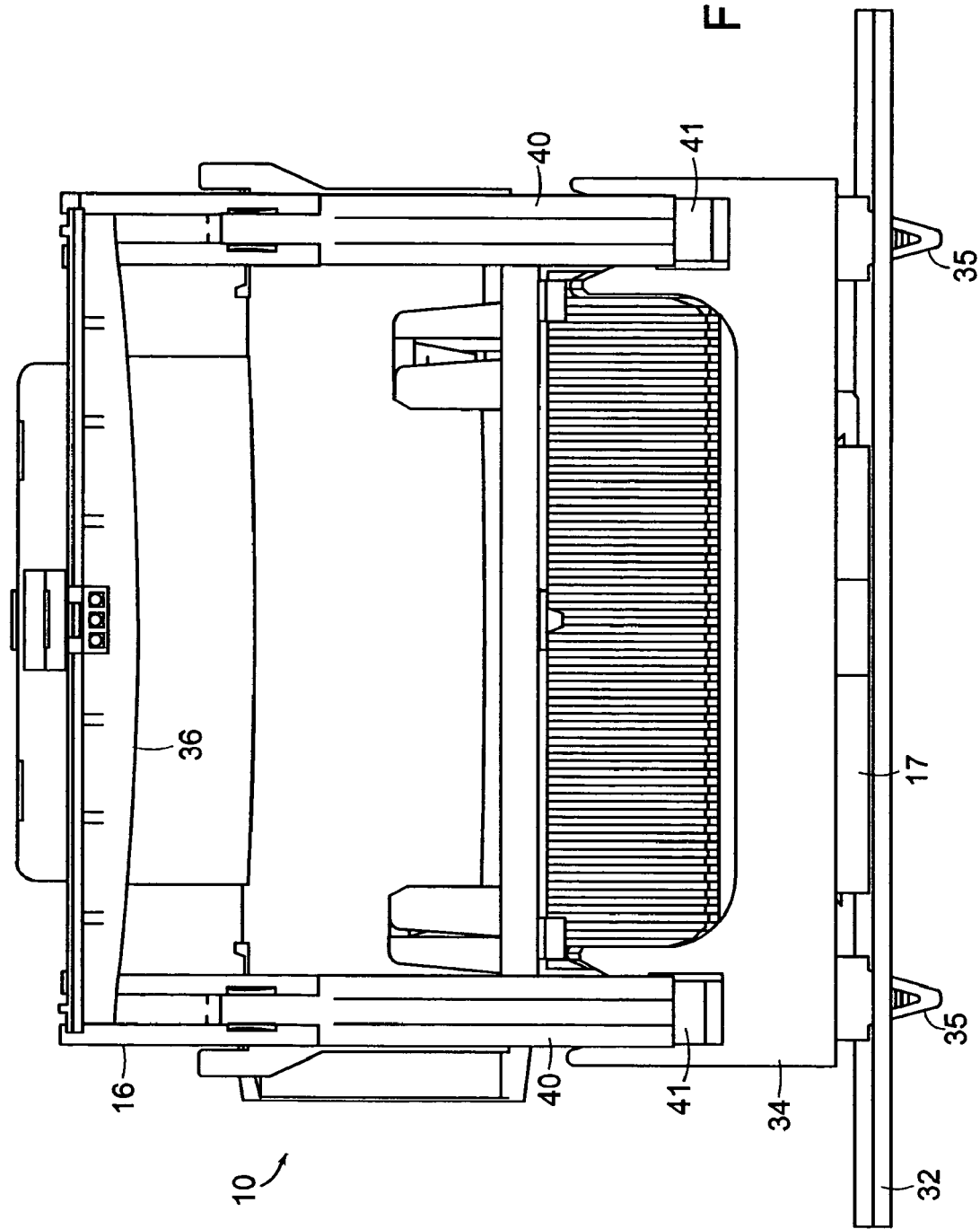
FIG. 4 is a rear view of the FIG. 1 active heat sink device shown mounted on an electronic device to be cooled.

Referring to FIG. 4, the spring clip attachment mechanism 16 secures the cooling device 10 in position on top of an electronic component 17, which usually is mounted on a printed circuit board 32. The spring clip attachment mechanism 16 applies a downward clamping force on the component 17 so as to reduce thermal interface resistances between the component 17 and the heat sink base plate 20. The spring clip attachment mechanism 16 couples with a clip retention mechanism 34, which can be affixed to a printed circuit board 32 using, e.g., clip retention elements 35.

The spring clip attachment mechanism 16 includes a cam lever handle 36, which is attached to two clip attachment brackets 38. Each of the clip attachment brackets 38 is attached to two clip legs 40. The cam lever handle 36 also has an eccentric cam follower portion 41, which enables a force to be applied to the component 17 by rotating the cam lever handle 36 from an open, generally vertical position (shown in FIGS. 1–3) to a closed, generally horizontal position (shown in FIG. 4). The clip legs 40 can have a variety of geometries, depending on the application. The clip legs 40 can be pivotally connected to a respective attachment bracket 38 through an attachment pivot point 42. The attachment pivot point 42 enables limited rotation of the clip leg 40 in order to facilitate ergonomic advantages in installing the heat sink to the clip retention mechanism 34. More specifically, the legs can be rotated at an angle from vertical and easily positioned in the clip retention mechanism, and thereafter locked into position by rotating the cam lever handle 36. Each clip leg 40 includes a clip foot 44, which interfaces with an opening 41 in the clip retention mechanism 34. Each clip foot 44 includes a raised shoulder at the end thereof to facilitate locking with the clip retention mechanism 35.

The spring clip attachment mechanism 16 can be attached to the blower housing using attachment bracket retention elements 46 located on the attachment brackets 38. The attachment bracket retention elements 46 can be coupled with a corresponding locking element 48 on the blower assembly motor side housing 26.

The spring clip attachment mechanism 16 thereby allows the heat sink to be quickly and easily installed on the device to be cooled. It can be constructed of various materials including plastic materials such as, e.g., GE Lexan 3412R.

The blower 14 causes air flow through the heat sink fin structure 18 to increase heat dissipation. Air is drawn in through the fins from opposite sides of the heat sink in the direction indicated by 50 (shown in FIGS. 1 and 3), and is exhausted from the blower exhaust 54 in the direction indicated by 52. Air exhausted from the blower 14 will ordinarily be vented out of a chassis (not shown) in which the active heat sink device 10 and the component to be cooled is housed (e.g., personal computer chassis).

The blower assembly can include a brush-less DC motor assembly, which is seated in a motor housing portion of the motorside blower housing 26. The lead wire assembly component of the motor assembly can be routed through an opening in the motor housing to lie external to the blower assembly. The motor assembly can be attached to the motor housing at attachment points 56. The attachment can be made at points 56 by, e.g., riveting, heat staking and ultrasonic welding. The motor includes an impeller 30, which interfaces directly with the rotating member of the motor assembly. The impeller 30 acts as the primary air moving mechanism, and is contained within the blower housing.

The blower housing also includes an inlet side portion 28 through which airflow from the heat sink fin structure 18 enters. The blower housing can include a plurality of locking tab features 58 which couple with corresponding locking features 60 of the inlet side portion of the housing. The locking tab features 58 can be wedge shaped and, during assembly with the inlet side portion of the blower housing 28, open up the inlet side locking features 60. When the inlet side housing 28 is fully seated to the motor side housing 26, the locking tab feature 58 sits beneath the top arm of the inlet side locking features 60, and the inlet side locking features 60 snap inwards, and lock the motor side 26 and inlet side 28 housing components securely in place.

The blower assembly can include retention features 62 located on the underside of the inlet side blower housing 28 that enable the blower assembly to be coupled with corresponding shroud attachment element locking features 64 located on the shroud attachment element 22 of the heat sink assembly 12.

The heat sink assembly 12 can readily be properly orientated relative to the blower assembly during assembly therewith using blower inlet side post alignment features 66 and blower inlet side face alignment features.

Crimping tabs 68 can be used to secure the shroud attachment element 22 in place on the heat sink assembly. Fin alignment trapping features 70 can be used to ensure proper alignment of the folded fin structure 18 with the shroud element 22.

Figure 5:
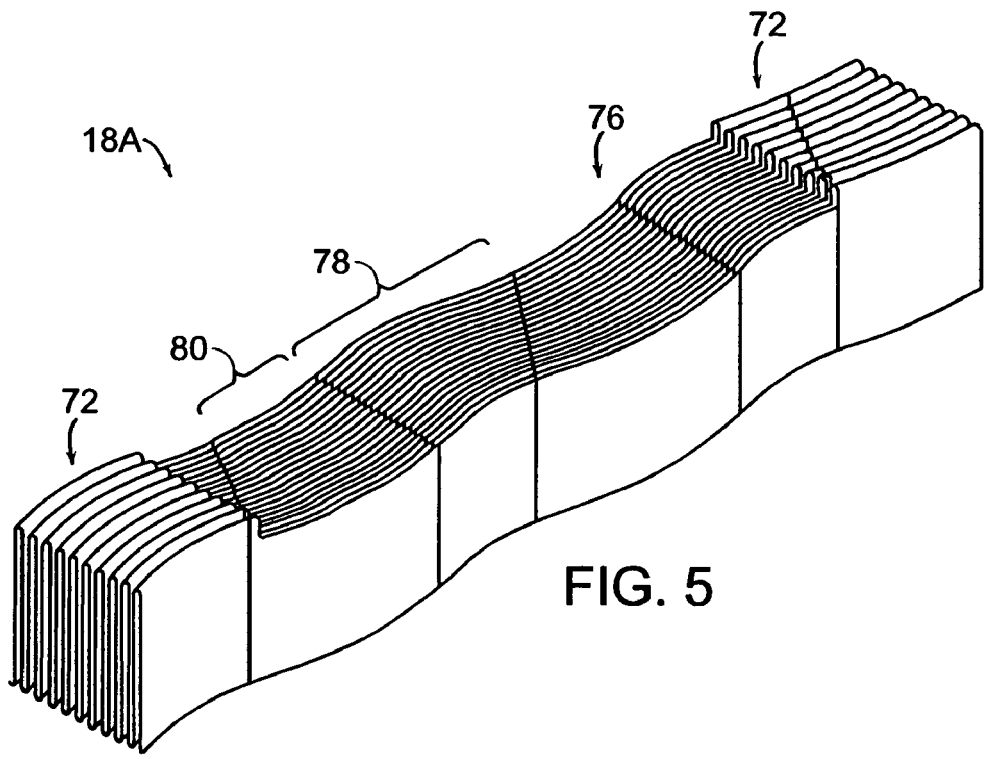
FIGS. 5 and 6 are perspective views of two alternate folded fin structures in accordance with one or more embodiments of the invention.
Figure 6:
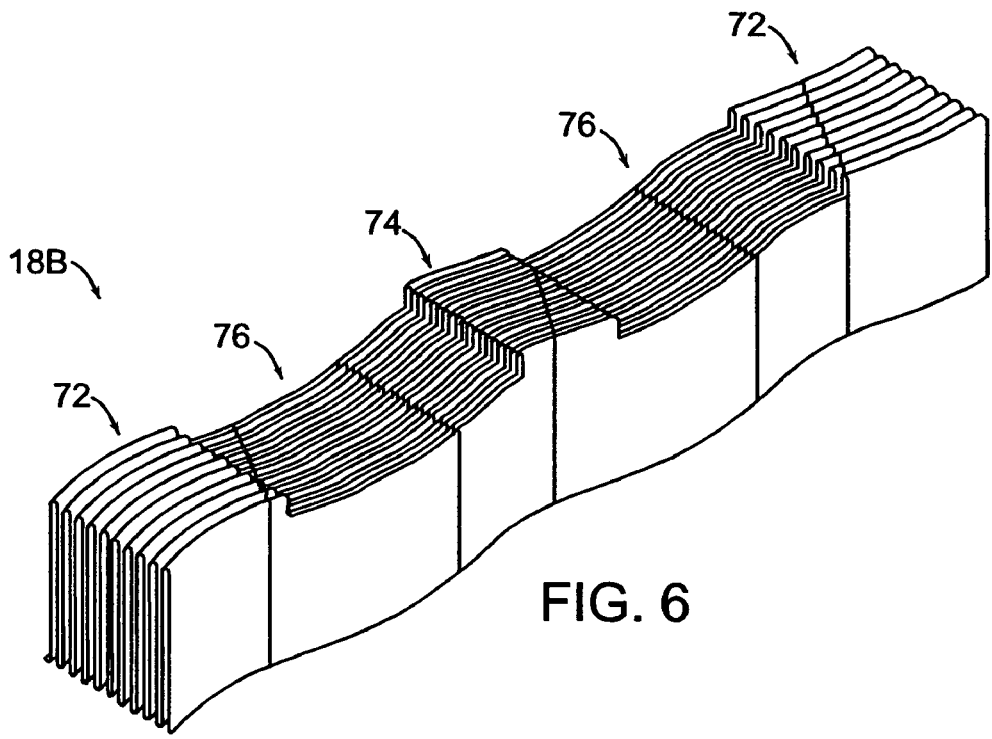
Figure 7:
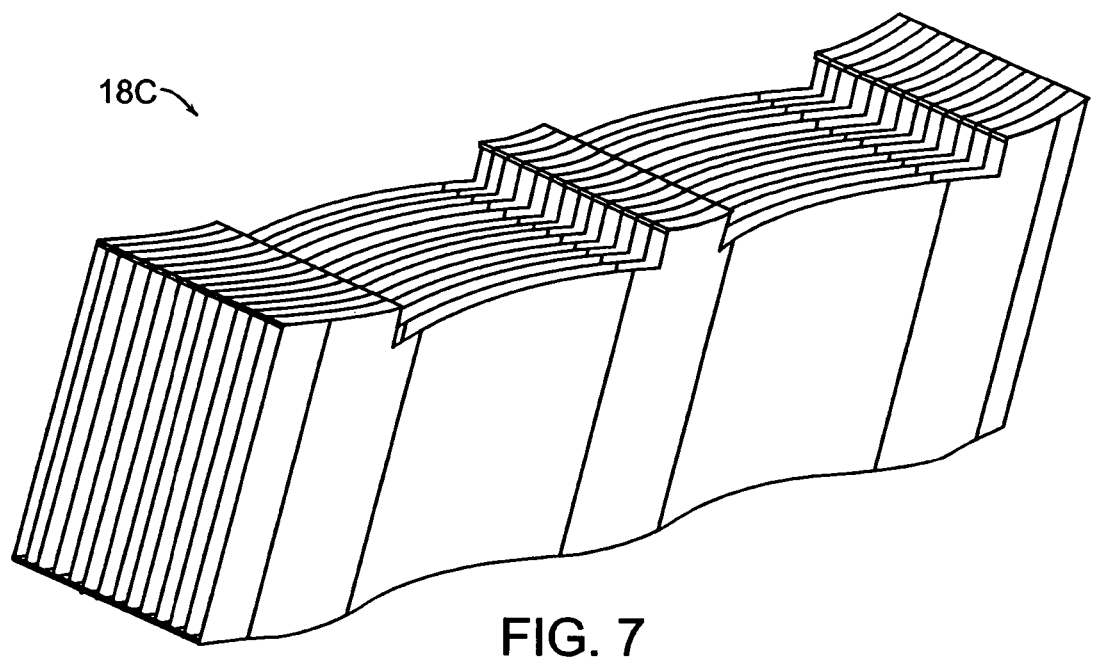
FIG. 7 is a perspective view of an alternate folded fin structure in accordance with one or more embodiments of the invention.

FIGS. 5 and 6 illustrate in greater detail two possible alternate folded fin structures 18A and 18B. (For purposes of illustration, only portions of the fin structures are shown.) The fin structures preferably comprise a set of ultra-thin fins that are densely arranged. The folded fin structures are preferably made of high thermal conductivity materials including, but not limited to, Aluminum 1100 and Copper Cu110. The individual fins of the fin structures are preferably generally plate-like having a small thickness such as, e.g., about 0.15 mm.

The fin structures shown in FIGS. 5 and 6 have a folded (i.e., convoluted) structure with each individual fin member being connected to one or both fins adjacent to it. In the FIG. 5 embodiment, the individual fin elements are connected at opposite ends 72 of the fin structure. In the FIG. 6 embodiment, the individual fin members are connected at the ends 72 of the fin structure and also at the center 74 of the structure.

Fin cut-outs 76 in the folded fin structures are present to allow an air-flow path between individual fins and are positioned at the blower inlet opening situated in the inlet side blower housing component 28.

The folded fin structure can be made by providing a sheet of fin material, punching openings in the material (which will form the fin cut-outs), and thereafter folding the material into the convoluted configuration. Alternately, the material is folded into the convoluted configuration, and then the fin cut-outs are made.

The folded fin structures preferably have a slightly serpentine or ruffled configuration, which provides added stiffness to the fins, allowing the fins to be thin and densely packed. The folded fins are therefore manufactured to have slight horizontal curvatures with, e.g., a typical horizontal crest radial curvature 78 between about 25 to 40 mm and, e.g., a typical horizontal root radial curvature 80 of between about 25 and 40 mm. This slight horizontal curvature allows the individual fins to have increased stiffness and reduced deflection. Consequently, thinner materials can be used, allowing higher fin folding densities including, e.g., about 25 to 40 fins per inch.

Figure 18:
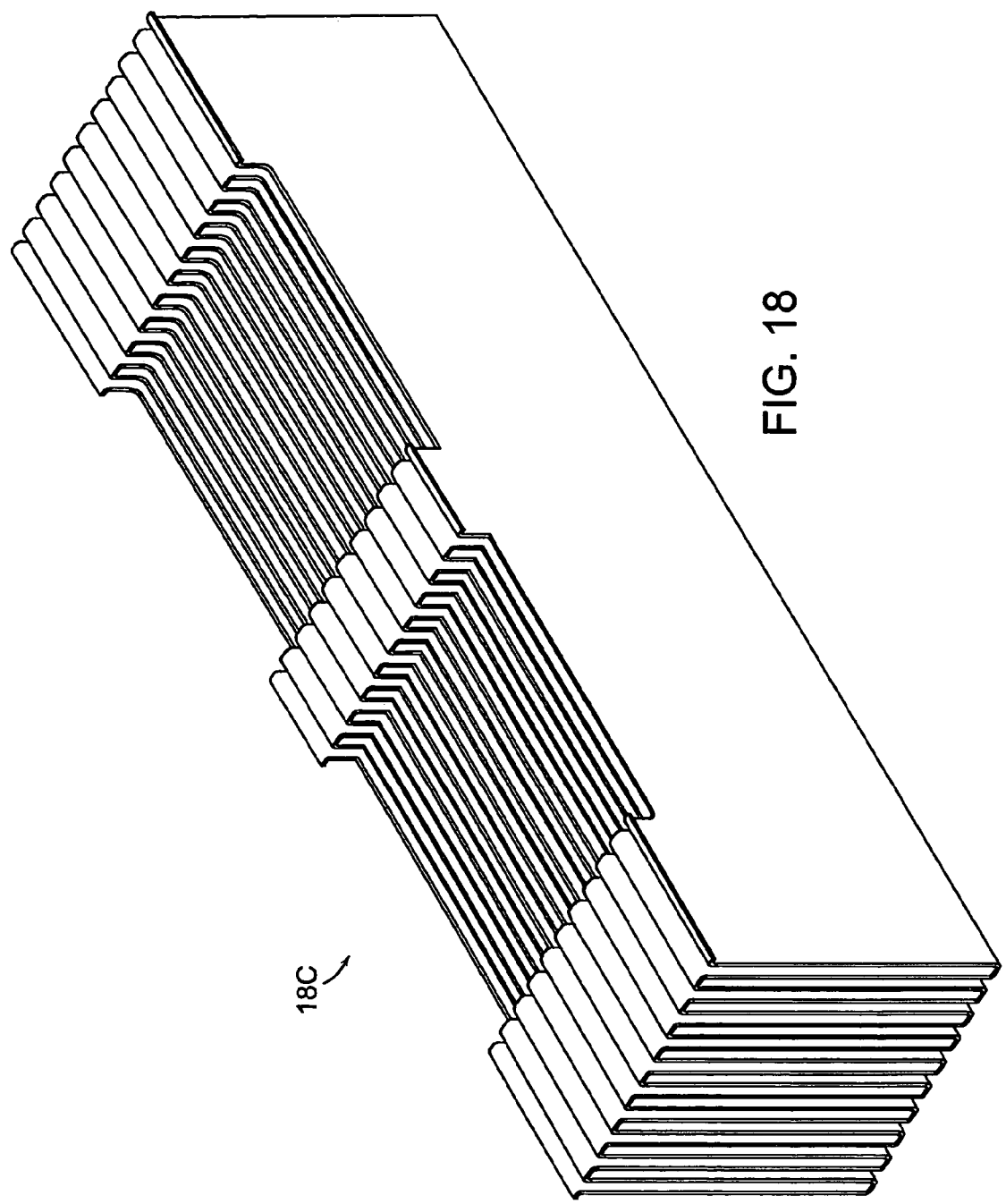
FIG. 18 is a perspective view of an alternate folded fin structure in accordance with one or more embodiments of the invention.

FIG. 18 illustrates an alternate folded fin structure 18C, in which the fins have a straight (i.e., not ruffled) configuration.

The fins in the fin structure preferably have a height of less than about 24 mm. More preferably, the fins have a height between about 17–24 mm.

The folded fin structure 18 can be soldered to the base plate 20 using, e.g., a tin-lead soldering process or a soldering process as described in U.S. patent application Ser. No. 10/073,991 (published as publication No. US2002/0139833), the specification of which is incorporated in its entirety herein be reference. The base plate 20 can have a contoured geometry with a flat square pedestal surface 82, which interfaces with the heat source, and a radial contoured region 84, which transitions to a uniform thickness top plate 86. This baseplate configuration reduces the weight of the device with little loss in thermal efficiency. The base plate 20 can have rectangular or V-shaped grooves 87 to facilitate connection with the shroud element attachment features 68, which are typically crimped tightly in place.

Figure 8:
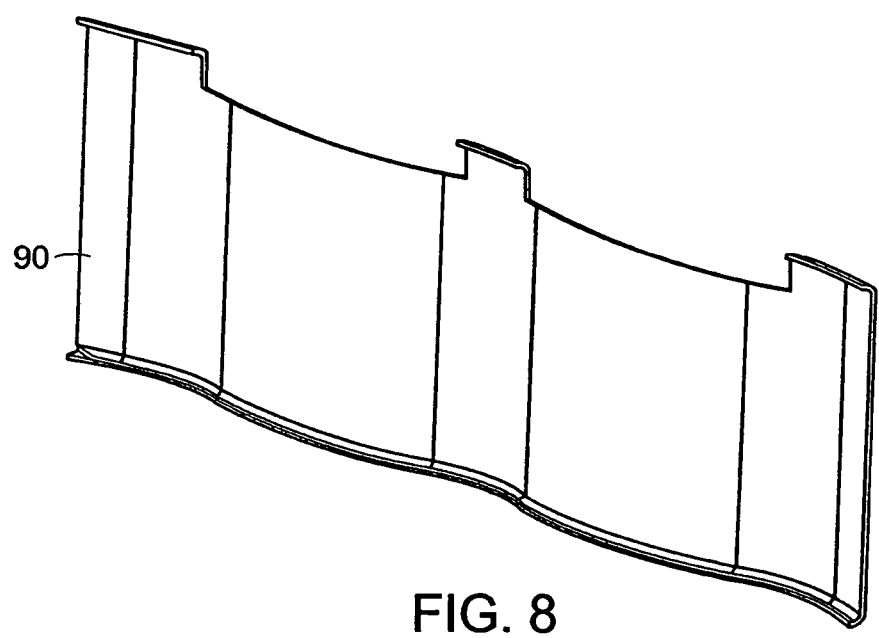
FIG. 8 is a perspective view of an individual fin of the FIG. 7 folded fin structure.

FIGS. 7 illustrates an alternate fin structure 18C in accordance with one or more embodiments of the invention. The fin structure shown in FIG. 7 is constructed of a plurality of individual fins 90, one of which is shown in FIG. 8. The individual fins can have a generally "⌊" shape cross-section or a generally "⌈" shape cross-section, or some combination of "⌊" and "⌈" shape portions as shown in FIG. 8. The individual fins 90 can be assembled together by stacking the fins and then connecting the fins together, e.g., by soldering. As with the fin structures 18A, 18B shown in FIGS. 5 and 6, the fin structure 18C can have a ruffled or slightly serpentine design to provide additional stiffness, allowing thinner fins to be used.

Fin structures can alternately include pressed-in or swaged fins, which are generally flat individual fins that are pressed into grooves (e.g., saw cut grooves) in a base plate.

The blower exhaust 54 can be oriented in various positions relative to the heat sink assembly depending on the particular application. In the heat sink embodiments shown in FIGS. 1–4, the blower exhaust 54 is oriented to exhaust air in a direction that can be about 70 to 110 degrees from the vertical plane of the individual fins (or, in other words, the general direction of the airflow through the fins) of the fin structure 18.

Figure 9:
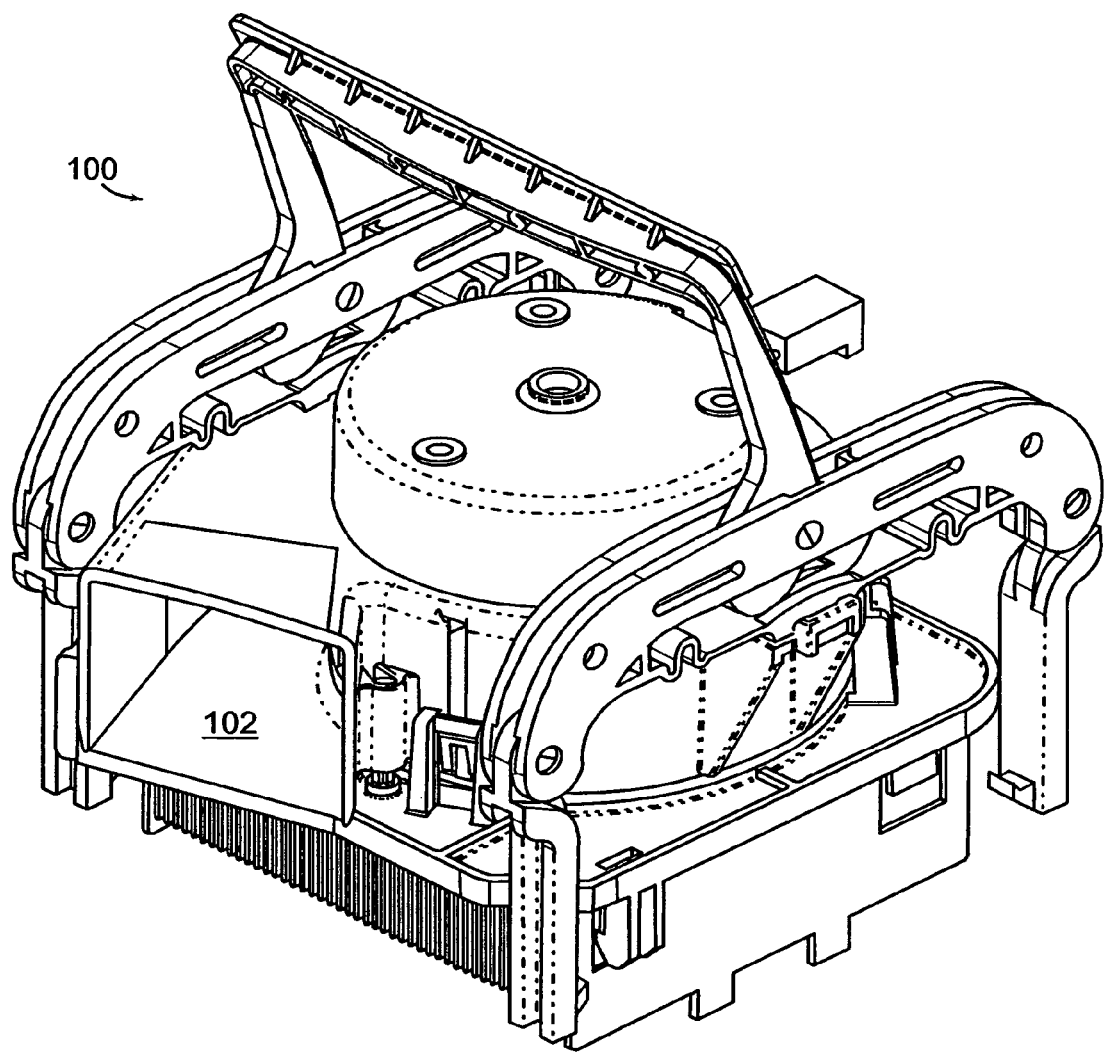
FIG. 9 is a perspective view of an alternate active heat sink device in accordance with one or more embodiments of the invention.

In an alternative embodiment shown in FIG. 9, an active heat sink device 100 includes a blower exhaust 102 oriented to exhaust air in a direction that can be about −20 and 20 degrees from the vertical plan of the individual fins of the fin structure.

Figure 10:
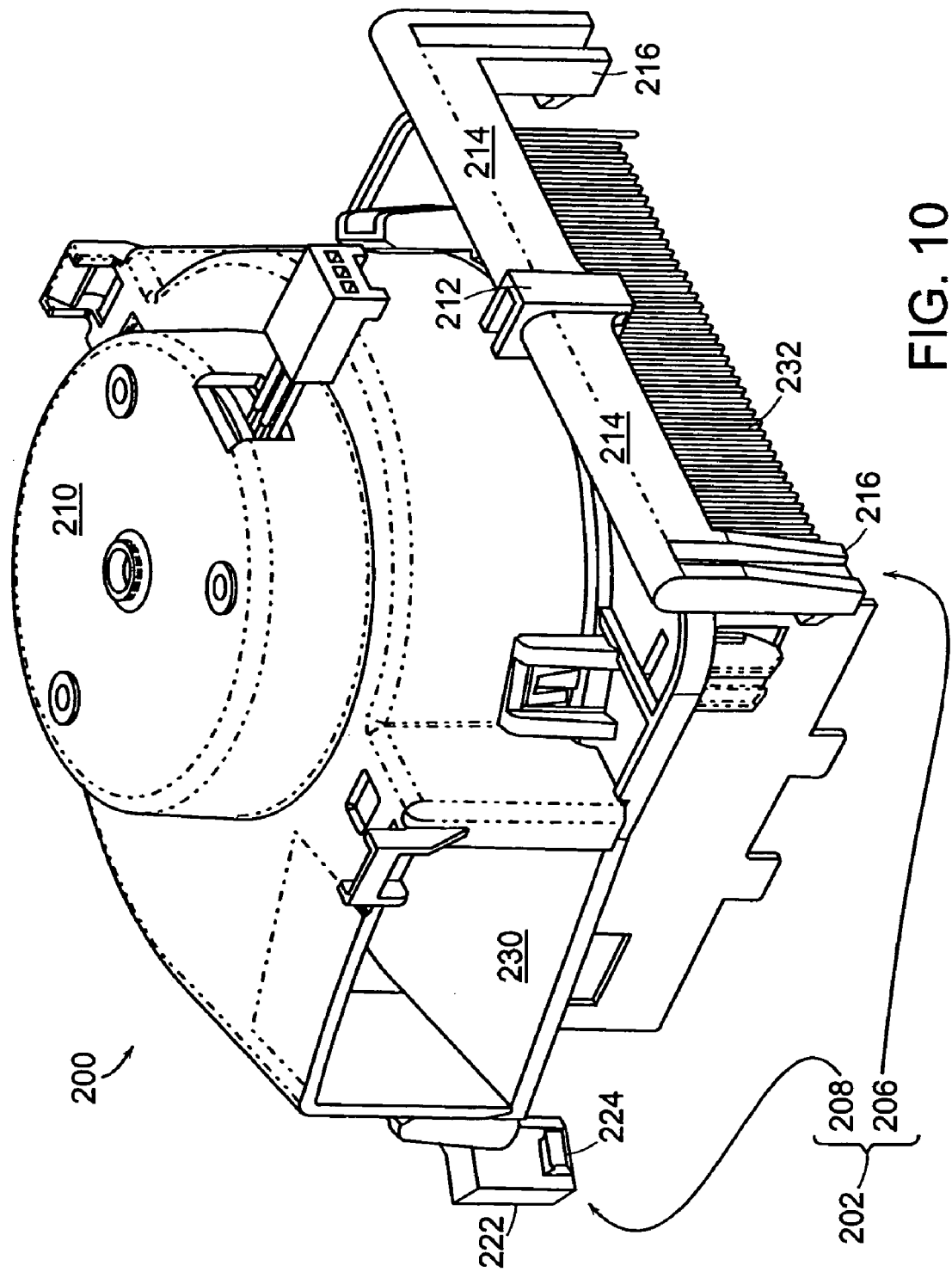
FIG. 10 is a perspective view of an alternate active heat sink device in accordance with one or more embodiments of the invention.
Figure 11:
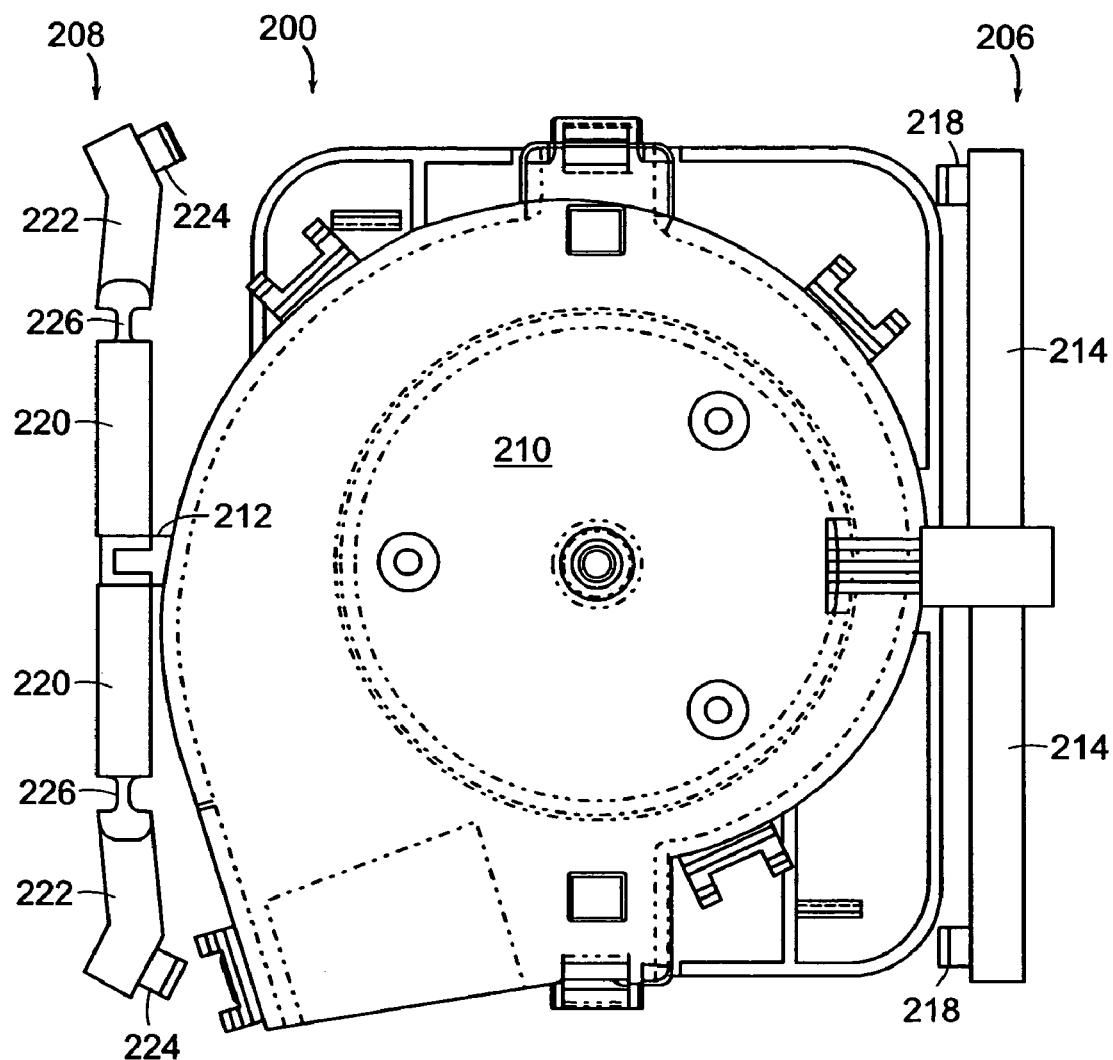
FIG. 11 is a top view of the FIG. 10 active heat sink device.

FIGS. 10 and 11 illustrate an active heat sink device 200 with an alternative spring clip attachment mechanism 202 in accordance with one or more embodiments of the invention.

The spring clip attachment mechanism 202 includes two spring clip members 206, 208 on opposite sides of the blower 210. Each spring clip member can be fixedly connected to the inlet side component of the blower housing by the two central attachment posts 212.

The spring clip member 206 includes two horizontal spring clip cantilevers 214 extending from the central attachment post 212. Downwardly extending members 216 are connected to the ends of the horizontal spring clip cantilevers 214. A clip attachment leg 218 is positioned at the end of each downwardly extending member 216. The clip attachment leg 218 can mate with a clip retention mechanism such as, e.g., the clip retention mechanism 34 shown in FIG. 4.

The spring clip member 208 includes two horizontal spring clip cantilevers 220, which are horizontally fixed, extending from the central attachment post 212, and two horizontal spring clip cantilevers 222, which are horizontally movable. Clip attach legs 224 are attached to the ends of the horizontally movable spring clip legs 222. A hinge 226 (which can comprise plastic) connecting the spring clip cantilevers 220 and 222 enables movement of the clip attach legs 224. This movable feature enables an operator assembling the active heat sink device to a heat source such as a microprocessor to apply downward pressure to the clip cantilevers 222 and move the movable legs 224 in place within the clip retention mechanism.

Thus, the active heat sink device 200 can be attached to the device to be cooled by first inserting the clip attachment legs 218 of the spring clip member 206 in respective openings in the clip retention mechanism, and then applying a downward force on and engage the moveable legs 224 of the spring clip member 208 with the clip retention mechanism.

In the heat sink device 200, the blower exhaust 230 is oriented to exhaust air in a direction that can range from about 70 to 110 degrees from the vertical plane of the individual fins of the heat sink fin structure 232.

Figure 12:
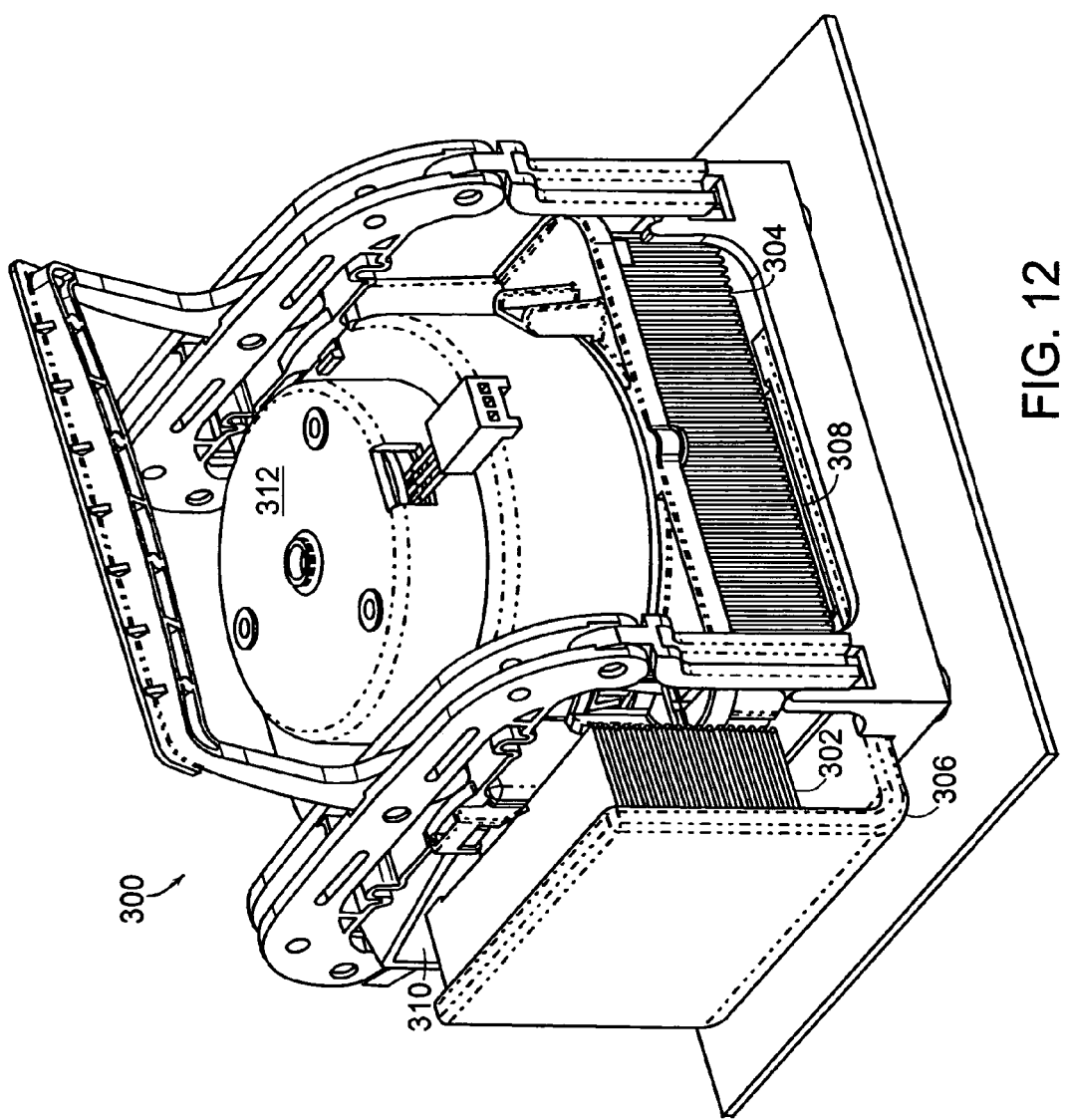
FIG. 12 is a perspective view of an alternate active heat sink device with dual folded fin structures in accordance with one or more embodiments of the invention.
Figure 13:
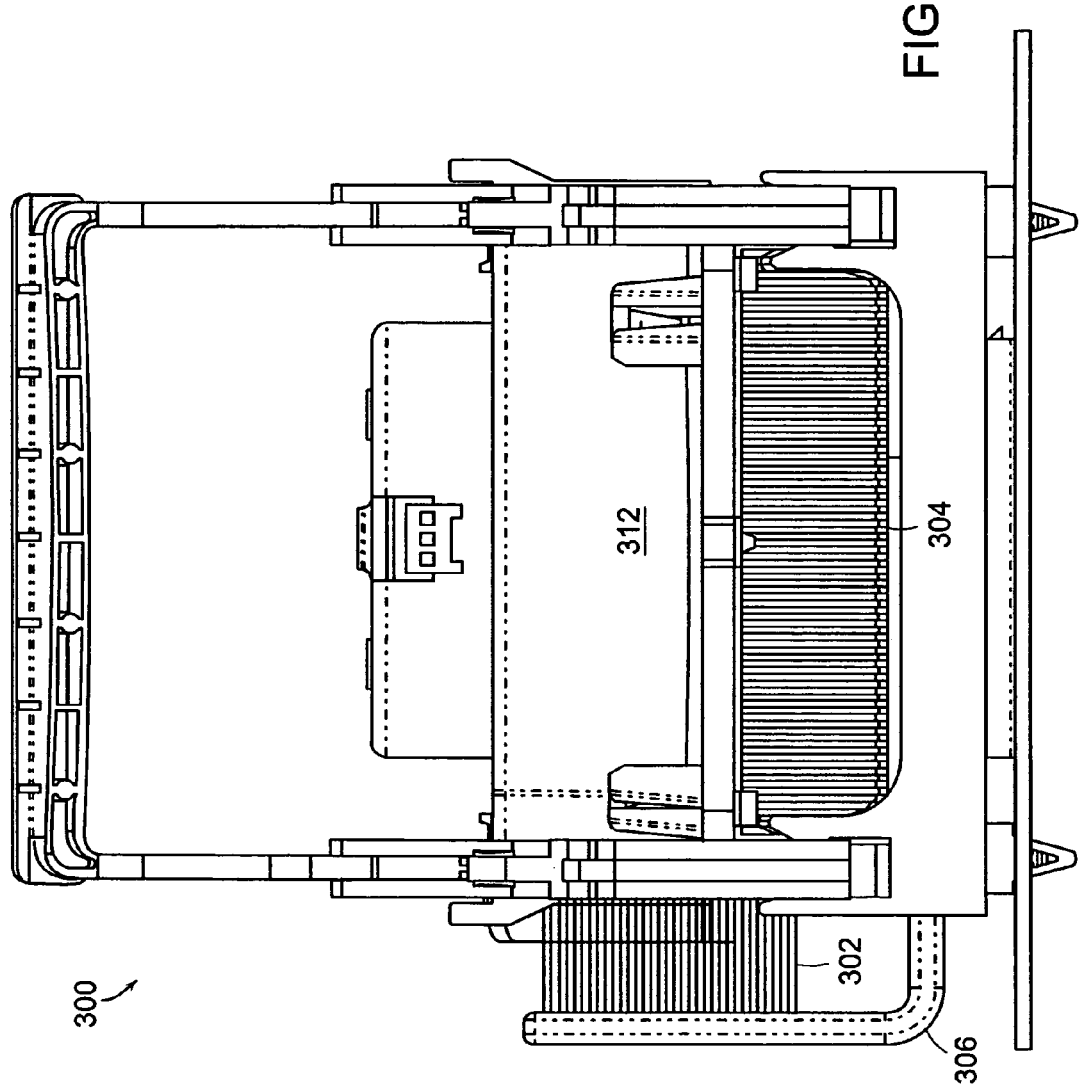
FIG. 13 is a front view of the FIG. 12 active heat sink device.

FIGS. 12 and 13 illustrate an active heat sink device 300 having dual or parallel fin structures in accordance with one or more alternate embodiments of the invention. The active heat sink device 300 is similar to the active heat sink device of FIGS. 1–4, but includes two fin structures: a primary fin structure 304 and a secondary fin structure 302 for enhanced heat transfer. The active heat sink device 300 can include a heat transfer element such as, e.g., a high thermal conductivity flat heat pipe 306, for transferring heat from the baseplate 308 on which the primary fin structure 304 is mounted to the secondary fin structure 302. Heat pipes that can be used are commercially available, e.g., from companies such as Furukawa, Fujikura, Thermacore, and AVC. Heat pipes are generally available in circular cylindrical configurations, but can be flattened in a pressing operation. In general, heat pipes can have an outer skin of copper, an internal wicking structure, and a supply of diluted water in a vacuum environment. The water boils and evaporates, resulting in super thermal conductivity internally.

This flat heat pipe 306 is attached to the copper base plate 308 in a manner that allows efficient heat transfer (i.e., with reduced thermal interface losses) using, e.g., soldering or press fit applications.

Alternatively, the flat heat pipe 306 can replace the copper base plate 308 and extend continuously from beneath the primary fin structure 304 to the secondary fin structure 302. The primary and secondary fin structures preferably have a folded fin construction, although they could also be constructed by assembling individual fins.

In operation, the active heat sink device 300, while continuing to provide heat transfer to the primary fin structure 304 also allows heat to be transferred to the secondary fin structure 302. The secondary fin structure 302 is preferably positioned at the blower exhaust 310, and thereby receives airflow from the blower 312, which also causes airflow across the primary fin structure 304.

In many cases, the calculation of the thermal resistance of a parallel heat sink is generally analogous to the calculation of the electrical resistance in a parallel resistor electrical circuit. The following formula can be used to calculate the overall thermal resistance. (In the formula, "TR" represents thermal resistance.)

$$TR_{overall} = (TR_{heat\ sink\ 1})(TR_{heat\ sink\ 2})/(TR_{heat\ sink\ 1} + TR_{heat\ sink\ 2})$$

This formula indicates that if a secondary heat sink is incorporated into the design with twice the thermal resistance of the primary heat sink, then the overall thermal resistance will become ⅔ of the thermal resistance of the primary heat sink. The net result is a more efficient thermal solution with only a modest volumetric increase.

Figure 14:
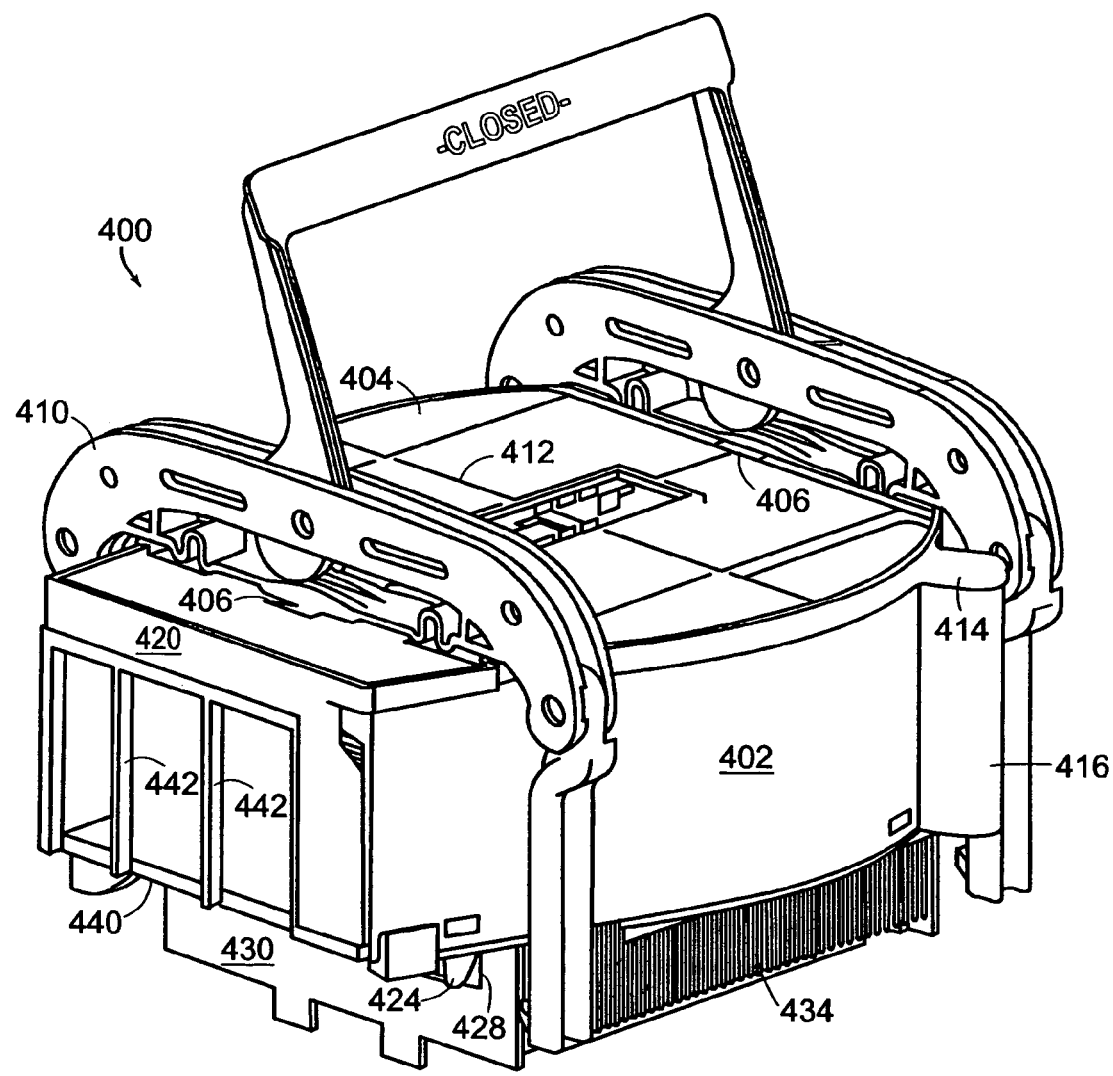
FIG. 14 is a perspective view of an alternate active heat sink device in accordance with one or more embodiments of the invention.
Figure 15:
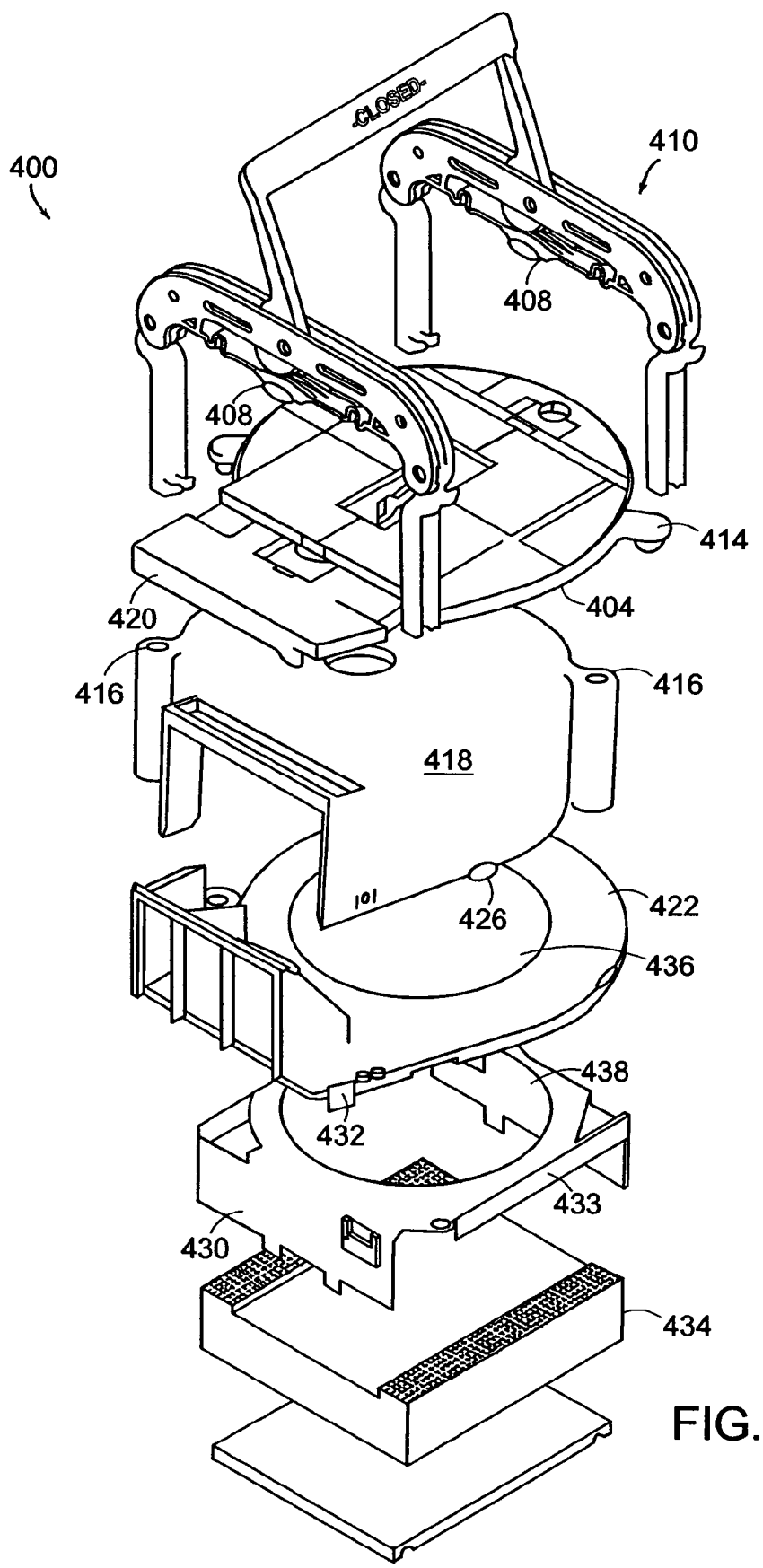
FIG. 15 is an exploded view of portions of the FIG. 14 active heat sink device.

FIGS. 14 and 15 illustrate an active heat sink device 400 in accordance with one or more alternate embodiments of the invention. The active heat sink device 400 is constructed from a slightly modified commercially available blower 402. One example of a suitable commercially available blower 402 is the NMB Model No. BG0903-B045-00S blower (available from NMB Technologies Corporation of Japan). The blower 402 has suitable airflow pressure drop performance capabilities for use in the active heat sink device. The blower 402 has a large form factor, and can be modified as described below such that it could be incorporated in the active heat sink device.

The active heat sink device 400 includes a top plate 404 configured to fit over the blower 402. The top plate 404 includes trapping features 406 designed to connect with corresponding trapping features 408 provided on the spring clip attachment mechanism 410. The top plate 404 can also include a framework of structural reinforcement ribs 412 designed to provide additional structural rigidity and support in order to facilitate the transfer of loads resulting from the engagement of the spring clip attachment mechanism 410. The top plate 404 can mate with the commercially available blower 402 using two cantilever clip press-in features 414 on the top plate. These press-in features can be pressed onto blower attachment posts 416 on the blower housing 418, and provide sufficient retention through a frictional fit with the blower housing. The top plate 404 can also include a blower exhaust element 420, which is configured to be positioned above a blower housing inlet side component 422 to form an alternative blower exhaust construction that better facilitates heated air removal by inhibiting heated air recirculation.

The blower housing inlet side component 422 is attached to the blower assembly 402. The blower housing inlet side component 422 includes a wall support feature 424 that assists in controlling the load deflection properties of the blower assembly 402 when subjected to the spring clip attachment mechanism 410. Blower assembly retention features 426 located on the underside of the blower housing inlet side 422 enables the blower assembly to be connected with a shroud attachment element locking feature 428 located on the shroud attachment element 430 of the heat sink assembly. Crimping tabs 432 can be used to position the shroud attachment element 430 in place on the heat sink assembly. Fin alignment trapping features 433 can be used to provide proper alignment of the folded fin structure 434 as well as to provide an efficient airflow path through the heat sink and into the blower housing inlet side opening 436 as well as the shroud attachment element's inlet side opening 438. Additionally, the blower housing inlet side component 422 can provide an alternative blower exhaust construction, which includes an extended base member component 440, and flow straightener elements 442. The flow straightener elements 442 can be used to cause airflow velocity vectors to exit in a direction that will reduce potential noise and acoustical vibration issues. This alternative blower exhaust construction better facilitates heated air removal and reduces the possibility of heated air recirculation.

The straightener elements 442 can also be used in each of the heat sink embodiments described herein to inhibit heated air recirculation.

Figure 16:
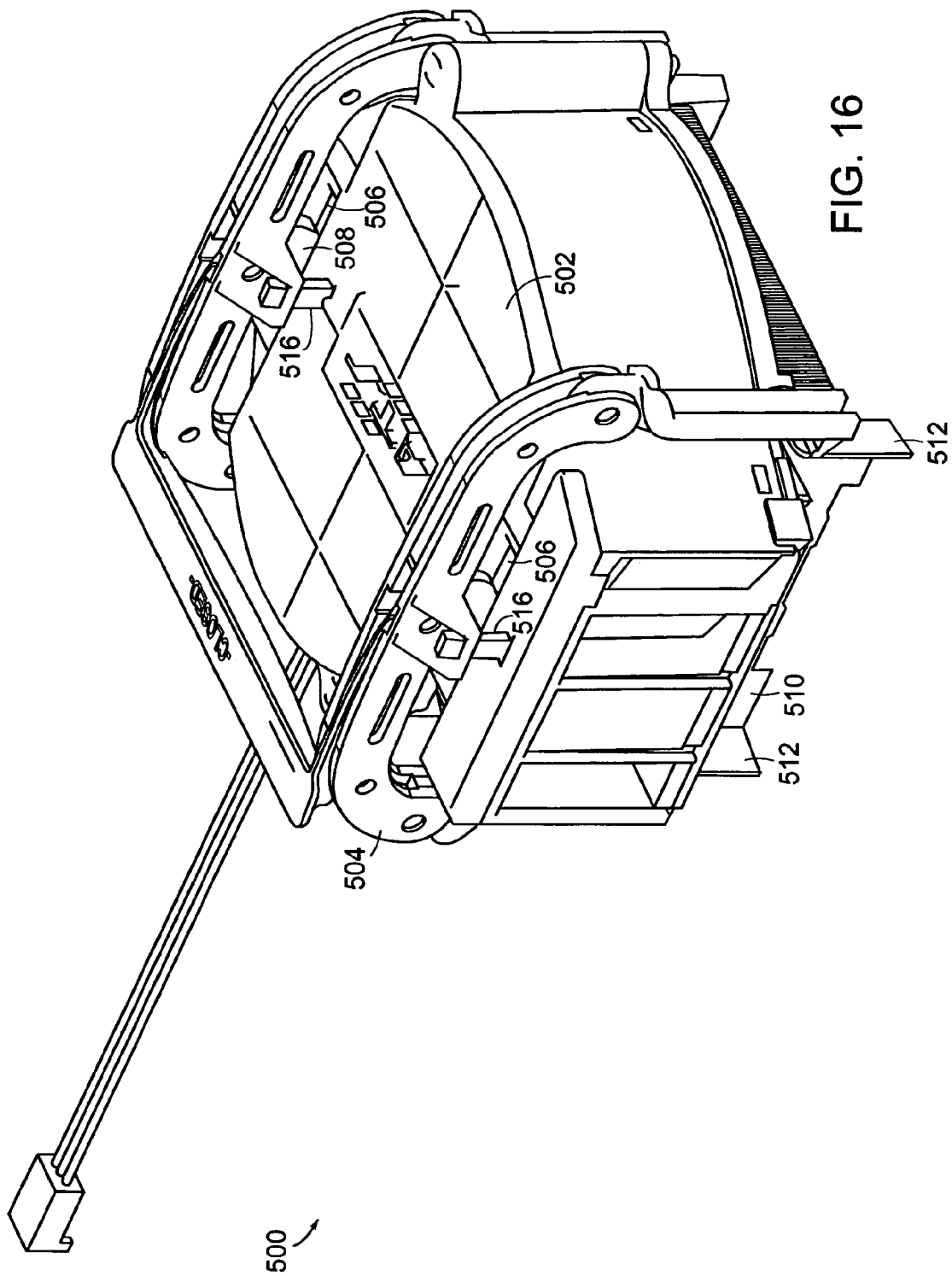
FIG. 16 is a perspective view of an alternate active heat sink device in accordance with one or more embodiments of the invention.
Figure 17:
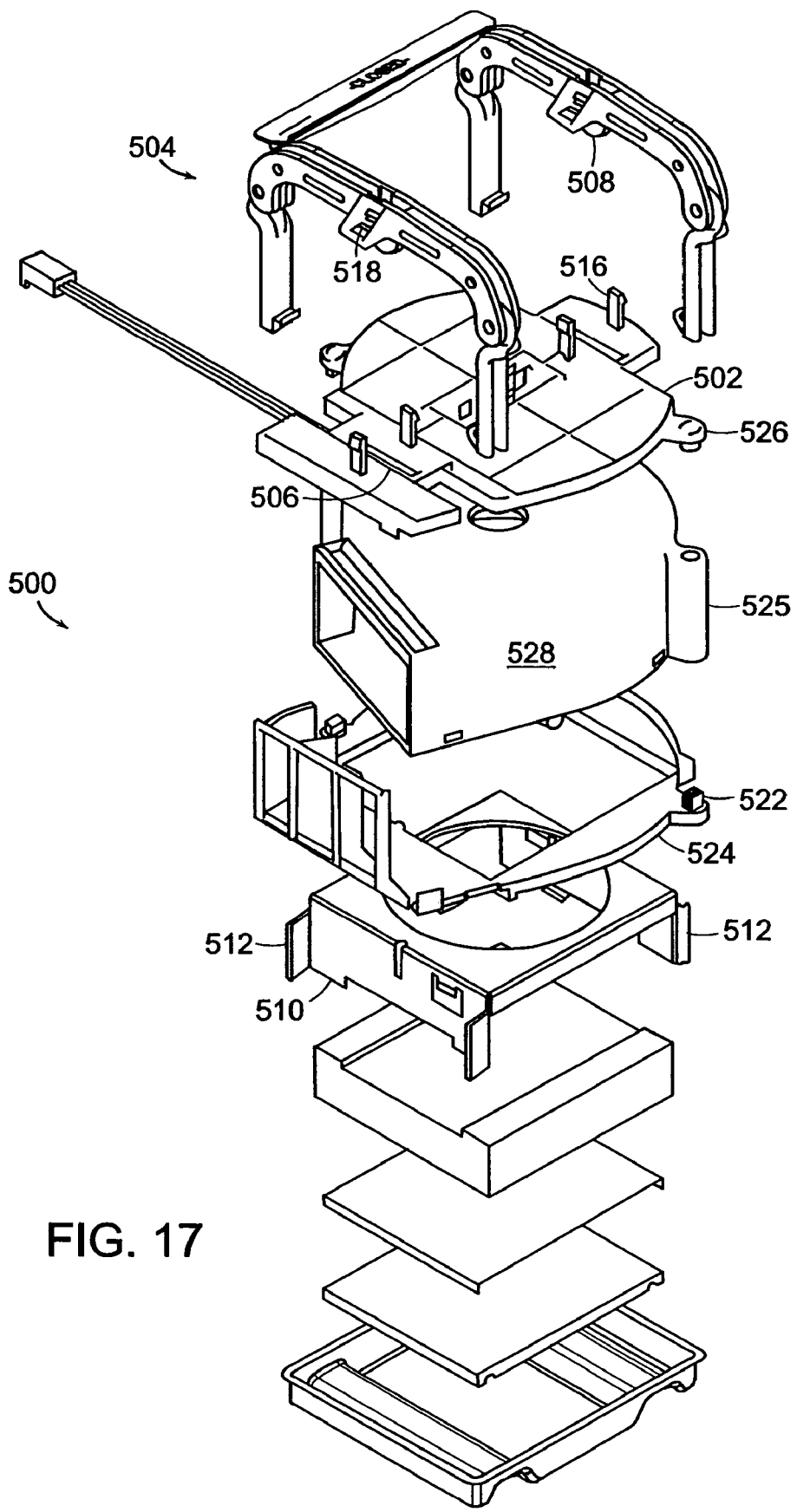
FIG. 17 is an exploded view of portions of the FIG. 16 active heat sink device.

FIGS. 16 and 17 illustrate an active heat sink device 500 in accordance with one or more further embodiments of the invention. The active heat sink device 500 is similar to the heat sink device 400 shown in FIGS. 14 and 15, but includes a modified top plate 502 and spring clip attachment mechanism 504. The top plate 502 includes two slots 506 for receiving and supporting a portion of the cam follower 508. This structure allows the overall height of the heat sink device 500 to be reduced.

In addition, the heat sink device 500 includes a shroud element 510, which includes bent projections 512 at the corners thereof. The projections 510 allow the shroud to more closely fit a clip retention element (which can be similar to the clip retention element 34 shown in FIG. 4). Accordingly, inadvertent movement of the heat sink device 500 relative to the clip retention element after assembly is reduced, thereby reducing the possibility of breakage or other damage.

The top plate 502 includes a plurality of snap features 516 that engage corresponding openings 518 in the spring clip attachment mechanism 504 for assembly of the top plate and the attachment mechanism.

The heat sink device 500 includes a blower housing inlet side component 524, which includes two press-in features 522 that can be pressed into respective blower attachments posts 525 on the blower housing 528 for assembly. The top plate 502 also includes two press-in features 526 that can be pressed into respective blower attachment posts 525 at opposite ends thereof from the press-in features 522.

Having described preferred embodiments of the present invention, it should be apparent that modifications can be made without departing from the spirit and scope of the invention.

What is claimed is:

1. A cooling device for dissipating heat from a heat source, comprising:
   a heat sink including a fin structure;
   an air moving device assembled with the heat sink for moving air through the fin structure; and
   a spring attachment mechanism for clamping the heat sink to the heat source, said spring attachment mechanism including two attachment brackets, each having one or more pivotally mounted attachment legs adapted for engagement with a retention mechanism fixed relative to said heat source, each attachment bracket having a levered cam for bearing on the heat sink, the levered cam moveable from a first position in which the levered cam does not press the heat sink against the heat source to a second position in which the levered cam presses the heat sink against the heat source; and said spring attachment mechanism also including a handle connecting the levered cams of the two attachment brackets so that movement of the handle engages both levered cams substantially simultaneously.

2. The cooling device of claim 1 wherein the heat sink further comprises a base plate, wherein said base plate interfaces with said heat source.

3. The cooling device of claim 1 wherein said heat source comprises an integrated circuit.

4. The cooling device of claim 1 wherein said air moving device draws ambient air through the fin structure and exhausts the air away from said heat source.

5. The cooling device of claim 1 wherein the fin structure has a folded fin construction.

6. The cooling device of claim 1 wherein said fin structure has a folded construction with portions thereof removed to permit airflow therethrough.

7. The cooling device of claim 1 wherein said fin structure comprises a plurality of fins stacked together.

8. The cooling device of claim 1 wherein said heat sink further comprises a base plate, and wherein said fin structure comprises a plurality of plate fins extending from said base plate.

9. The cooling device of claim 1 wherein fins in said fin structure have a serpentine configuration.

10. The cooling device of claim 9 wherein said serpentine configuration includes curves having a radius of about 25 mm to 35 mm.

11. The cooling device of claim 1 wherein said fin structure comprises a plurality of fins, each having a thickness of about 0.15 mm.

12. The cooling device of claim 1 wherein said fin structure comprises a plurality of fins, said fin structure having a fin density of about 25–35 fins per inch.

13. The cooling device of claim 1 wherein said fin structure comprises a plurality of fins, each fin having a fin height of less than 24 mm, and wherein said fin structure has a fin density of about 25 to 35 fins per inch.

14. The cooling device of claim 1 wherein the heat sink further comprises a shroud, and wherein said air moving device includes at least one attachment leg which, when pushed down onto the shroud securely secures the air moving device to the heat sink.

15. The cooling device of claim 1 wherein the air moving device includes an exhaust oriented to exhaust air in a direction that is about 70 and 110 degrees from the general direction of airflow into said fin structure.

16. The cooling device of claim 1 wherein the air moving device includes an exhaust oriented to exhaust air in a direction that is about –20 and 20 degrees from the general direction of airflow into said fin structure.

17. The cooling device of claim 1 wherein the heat sink includes an additional secondary fin structure.

18. The cooling device of claim 17 wherein said secondary fin structure is positioned at an exhaust of the air moving device.

19. The cooling device of claim 17 wherein said secondary fin structure is thermally coupled to a base plate on which said fin structure is mounted.

20. The cooling device of claim 19 wherein said secondary fin structure is thermally coupled to the base plate with a heat pipe.

21. The cooling device of claim 1 wherein the air moving device includes an exhaust having at least one protrusion for directing exhaust air out of the air moving device in a direction inhibiting exhaust air recirculation in the air moving device.

22. The cooling device of claim 21 wherein said protrusion comprises a flow straightener element for reducing the possibility of acoustical resonant conditions.

23. The cooling device of claim 1 wherein said air moving device comprises a blower.

24. The cooling device of claim 1 wherein the fin structure comprises a plurality of fins, each fin having a height between about 17 mm to 24 mm.

25. The cooling device of claim 2 wherein said base plate comprises a thermally conductive material selected from the group consisting of copper, aluminum, pyrolytic graphite, and ALSiC-9 materials.

26. The cooling device of claim 2 wherein said fin structure is soldered to said base plate.

27. The cooling device of claim 8 wherein each plate fin has at least a portion thereof that is generally shaped in cross-section like the capital letter "L" or a square bracket.

28. The cooling device of claim 8 wherein said fins are pressed into grooves in said base plate.

29. A cooling device for dissipating heat from a heat source, comprising:
   a heat sink including a fin structure;

an air moving device assembled with the heat sink for moving air through the fin structure; and a spring attachment mechanism for clamping the heat sink to the heat source, wherein the spring attachment mechanism includes members at opposite ends of said air moving device, said members including elements engageable with a retention mechanism fixed relative to said heat source to clamp the heat sink to the heat source, one of said members including push down features resiliently movable into engagement with the retention mechanism, wherein said member with the push down features includes two horizontally movable cantilevers having legs at ends thereof that are engageable with the retention mechanism.

30. The cooling device of claim 29 wherein the heat sink further comprises a base plate, wherein said base plate interfaces with said heat source.

31. The cooling device of claim 29 wherein said heat source comprises an integrated circuit.

32. The cooling device of claim 29 wherein said air moving device draws ambient air through the fin structure and exhausts the air away from said heat source.

33. The cooling device of claim 29 wherein the fin structure has a folded fin construction.

34. The cooling device of claim 29 wherein said fin structure has a folded construction with portions thereof removed to permit airflow therethrough.

35. The cooling device of claim 29 wherein said fin structure comprises a plurality of fins stacked together.

36. The cooling device of claim 29 wherein said heat sink further comprises a base plate, and wherein said fin structure comprises a plurality of plate fins extending from said base plate.

37. The cooling device of claim 29 wherein fins in said fin structure have a serpentine configuration.

38. The cooling device of claim 37 wherein said serpentine configuration includes curves having a radius of about 25 mm to 35 mm.

39. The cooling device of claim 29 wherein said fin structure comprises a plurality of fins, each having a thickness of about 0.15 mm.

40. The cooling device of claim 29 wherein said fin structure comprises a plurality of fins, said fin structure having a fin density of about 25–35 fins per inch.

41. The cooling device of claim 29 wherein said fin structure comprises a plurality of fins, each fin having a fin height of less than 24 mm, and wherein said fin structure has a fin density of about 25 to 35 fins per inch.

42. The cooling device of claim 29 wherein the heat sink further comprises a shroud, and wherein said air moving device includes at least one attachment leg which, when pushed down onto the shroud securely secures the air moving device to the heat sink.

43. The cooling device of claim 29 wherein the air moving device includes an exhaust oriented to exhaust air in a direction that is about 70 and 110 degrees from the general direction of airflow into said fin structure.

44. The cooling device of claim 29 wherein the air moving device includes an exhaust oriented to exhaust air in a direction that is about −20 and 20 degrees from the general direction of airflow into said fin structure.

45. The cooling device of claim 29 wherein the heat sink includes an additional secondary fin structure.

46. The cooling device of claim 45 wherein said secondary fin structure is positioned at an exhaust of the air moving device.

47. The cooling device of claim 45 wherein said secondary fin structure is thermally coupled to a base plate on which said fin structure is mounted.

48. The cooling device of claim 47 wherein said secondary fin structure is thermally coupled to the base plate with a heat pipe.

49. The cooling device of claim 29 wherein the air moving device includes an exhaust having at least one protrusion for directing exhaust air out of the air moving device in a direction inhibiting exhaust air recirculation in the air moving device.

50. The cooling device of claim 49 wherein said protrusion comprises a flow straightener element for reducing the possibility of acoustical resonant conditions.

51. The cooling device of claim 29 wherein said air moving device comprises a blower.

52. The cooling device of claim 29 wherein the fin structure comprises a plurality of fins, each fin having a height between about 17 mm to 24 mm.

53. The cooling device of claim 30 wherein said base plate comprises a thermally conductive material selected from the group consisting of copper, aluminum, pyrolytic graphite, and ALSiC-9 materials.

54. The cooling device of claim 30 wherein said fin structure is soldered to said base plate.

55. The cooling device of claim 36 wherein each plate fin has at least a portion thereof that is generally shaped in cross-section like the capital letter "L" or a square bracket.

56. The cooling device of claim 36 wherein said fins are pressed into grooves in said base plate.

* * * * *